United States Patent
Okada et al.

(10) Patent No.: US 7,247,851 B2
(45) Date of Patent: Jul. 24, 2007

(54) IMAGING DEVICE AND AN IMAGING METHOD

(75) Inventors: Tsuyoshi Okada, Kanagawa (JP); Hirofumi Ishii, Kanagawa (JP); Kazufumi Mizusawa, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 98 days.

(21) Appl. No.: 10/533,853

(22) PCT Filed: Apr. 22, 2004

(86) PCT No.: PCT/JP2004/005799

§ 371 (c)(1),
(2), (4) Date: May 4, 2005

(87) PCT Pub. No.: WO2005/045936

PCT Pub. Date: May 19, 2005

(65) Prior Publication Data
US 2006/0114551 A1    Jun. 1, 2006

(30) Foreign Application Priority Data
Nov. 10, 2003    (JP) .............................. 2003-380208

(51) Int. Cl.
*G11J 5/02*    (2006.01)
*G06K 7/10*    (2006.01)
*H01L 25/00*    (2006.01)
*H01L 27/00*    (2006.01)

(52) U.S. Cl. ........................... 250/339.02; 250/339.05; 250/332; 250/208.1; 359/350

(58) Field of Classification Search ............. 250/341.7, 250/341.1, 208.1, 226, 339.02, 339.05, 332; 257/440, 443, 292; 359/350
See application file for complete search history.

(56) References Cited

U.S. PATENT DOCUMENTS 3,858,046 A * 12/1974 Cubalchini .................. 250/353

(Continued)

FOREIGN PATENT DOCUMENTS

JP    55-52277    4/1980

(Continued)

OTHER PUBLICATIONS

Supplementary European Search Report dated Feb. 2, 2007 (EP 04 72 8931).

*Primary Examiner*—David Porta
*Assistant Examiner*—Faye Boosalis
(74) *Attorney, Agent, or Firm*—Pearne & Gordon LLP

(57) ABSTRACT

An optical lens 1 makes three components of visible light and near infrared light in different wavelength regions severally form images at different locations according to their wavelengths. An imaging element 2 has a plurality of pixels, which include pixels having a visible light detection section 6 and pixels having a near infrared light detection section 8. The visible light detection section 6 has three detectors 3, 4, and 5 which detect three components of visible light which form images at locations of different depths in the same pixel according to their wavelengths. The near infrared light detection section 8 has a near infrared light detector 7 which detects near infrared light which forms an image at a location of a depth different from the depths at which the three components of visible light form images. Clear color images with good color reproducibility are obtained by the visible light detection section 6, and at the same time clear luminance information or monochrome images are obtained by the near infrared light detection section 8.

9 Claims, 12 Drawing Sheets

U.S. PATENT DOCUMENTS

| | | | | |
|---|---|---|---|---|
| 4,238,760 A * | 12/1980 | Carr | | 257/443 |
| 4,581,625 A | 4/1986 | Gay | | |
| 4,677,289 A | 6/1987 | Nozaki | | |
| 5,926,238 A * | 7/1999 | Inoue et al. | | 349/61 |
| 5,965,875 A * | 10/1999 | Merrill | | 250/226 |
| 6,094,281 A * | 7/2000 | Nakai et al. | | 358/512 |
| 6,198,147 B1 * | 3/2001 | Connolly | | 257/461 |
| 6,211,521 B1 * | 4/2001 | Bawolek et al. | | 250/339.02 |
| 6,380,539 B1 * | 4/2002 | Edgar | | 250/339.05 |
| 6,731,397 B1 * | 5/2004 | Merrill et al. | | 358/1.16 |
| 6,759,646 B1 * | 7/2004 | Acharya et al. | | 250/226 |
| 6,770,882 B2 * | 8/2004 | Carr et al. | | 250/338.1 |
| 6,998,660 B2 * | 2/2006 | Lyon et al. | | 257/294 |
| 7,075,079 B2 * | 7/2006 | Wood | | 250/332 |
| 7,129,466 B2 * | 10/2006 | Iwasaki | | 250/214.1 |
| 7,154,157 B2 * | 12/2006 | Bradski et al. | | 257/440 |
| 2001/0020677 A1 * | 9/2001 | Urano et al. | | 250/271 |
| 2001/0043163 A1 * | 11/2001 | Waldern et al. | | 345/7 |
| 2002/0131648 A1 * | 9/2002 | Hayashide | | 382/275 |
| 2002/0190254 A1 | 12/2002 | Turner | | |
| 2003/0001093 A1 * | 1/2003 | Wood | | 250/332 |
| 2003/0132386 A1 * | 7/2003 | Carr et al. | | 250/338.1 |
| 2004/0256561 A1 * | 12/2004 | Beuhler et al. | | 250/339.05 |
| 2005/0029456 A1 * | 2/2005 | Eggers et al. | | 250/339.02 |
| 2006/0054987 A1 * | 3/2006 | Nii | | 257/440 |

FOREIGN PATENT DOCUMENTS

| | | |
|---|---|---|
| JP | 61 187282 A | 8/1986 |
| JP | 01 134966 A | 5/1989 |
| JP | 06-205162 | 7/1994 |
| JP | 07-074340 | 3/1995 |
| JP | 2002-142228 | 5/2002 |
| JP | 2002-513145 | 5/2002 |
| JP | 2003-304548 | 10/2003 |
| WO | 00/72604 A1 | 11/2000 |
| WO | 02/27804 A2 | 4/2002 |

* cited by examiner

IMAGING DEVICE AND AN IMAGING METHOD

TECHNICAL FIELD

The present invention relates to an imaging device and imaging method for detecting and receiving three components of visible light and near infrared light in different wavelength regions and for imaging pictures of both visible light and near infrared light.

BACKGROUND ART

Conventional visible light and near infrared light imaging devices have a configuration in which each of pixels can detect one of three colors of different wavelengths in visible light and near infrared light and such pixels are arranged in a mixed manner in the same imaging element, for example a CCD or CMOS imaging element (e.g. see FIG. 2 of Japanese Patent Laid-Open Application No. 2002-142228). For example, as shown in FIG. 10, Mg (magenta) color detectors 81, Ye (yellow) color detectors 82, Cy (cyan) color detectors 83, and near infrared light detectors 84 are arranged on an imaging element like amosaic so that the combination repeats lengthwise and crosswise. Here, one detector corresponds to just one pixel.

Incidentally, a bare pixel has a property of detecting visible light and near infrared light of 400 nm to 1000 nm. And an Mg color detector 81 is composed of a pixel covered with a bandpass filter for the region of the Mg color. The Ye color detectors 82 and Cy color detectors 83 are also composed of pixels covered with bandpass filters which derive the regions of their respective wavelengths. Bare pixels are arranged as the near infrared light detectors 84. Properly speaking, the visible light region requires to be cut off. But it need not be cut off because obtaining luminance information will suffice. The above configuration allows imaging pictures of both visible light and near infrared light.

In one of previously-suggested visible light imaging devices, three photodiodes are formed on a silicon substrate at different depths from the surface. This conventional device uses absorbance differences in silicon among three kinds of light of different wavelengths in the visible light region, e.g. blue, green, and red, to detect the three kinds of light of different wavelengths (e.g. see FIGS. 5 and 6 of Published Japanese Translation of PCT International Application (Tokuhyo) No. 2002-513145). In this visible light imaging device, three photodiodes of different depths can be arranged in one pixel. This prior art can therefore enable higher color resolution and prevent degradation of image quality caused by false color, in comparison with an art in which one pixel detects one color.

FIG. 11 shows the structure of a pixel formed on an imaging element. An n-type doped region 92 of an n-type semiconductor is formed on a p-type semiconductor substrate 91. Similarly, a p-type doped region 93 is formed thereon. Moreover, an n-type doped region 94 is formed thereon. In this way, a three-layer semiconductor structure (triple-well structure) is made on the substrate. Since each pn interface region can function as a photosensor, three photosensors can be made up in total.

Now, as described in FIG. 5 of Published Japanese Translation of PCT International Application (Tokuhyo) No. 2002-513145 as reference data, blue light is absorbed at a depth of 0.2 μm in a silicon layer. Green is absorbed at 0.6 μm, and red is not absorbed until it reaches a depth of 2 μm. Accordingly, depths of interfaces, which work as photosensors for each light, are set to 0.2 μm, 0.6 μm, and 2 μm respectively. Three colors (three wavelength bands) of light can thus be taken out almost spectrally. Then, an electric current generated by blue light is detected by a current detector 95. Similarly, green light is detected by a current detector 96, and red light is detected by a current detector 97. In this way, colors can be extracted numerically. Of course, it is actually impossible to separate light completely. But a degree of mixing of each color is known (or can be measured) in advance, so corrections can be made.

The above-mentioned three-layer semiconductor doping structure allows one pixel to take out three colors of visible light and can realize a visible light imaging device with significantly improved color resolution.

However, in conventional visible light and near infrared light imaging devices such as the one described in the above-mentioned Japanese Patent Laid-Open Application No. 2002-142228, individual pixels can only detect one color (limited wavelength region). Other colors and luminance information need to be complemented with information from adjacent pixels. Because of this, color resolution and luminance resolution decrease, and false color, which is not the original color, appears.

In addition, an optical system comprising optical lenses commonly provides an image of a subject on the surface of an imaging element. Since focuses fundamentally differ depending on wavelengths, chromatic aberration occurs in imaged pictures (when one color comes into focus, the others go out of focus). So, as shown in FIG. 12, for example, an optical system having a property of an achromatic lens is commonly provided so that an imaging element is within the depth of focus (color shift is negligible within the range) with regard to magenta, yellow, and cyan in the visible light region, and the optical system therefore focuses.

However, there is a limit to achromatism. It is difficult to make a perfect achromatic optical system for a very wide range of wavelengths from the visible light region to the near infrared light region (from 400 nm to 1000 nm). Even if it could be made, such optical system would be very expensive, so that it is difficult to use in current common industries (it is impossible to match all the focus points of visible light and near infrared light to each other). For this reason, when visible light and infrared light are detected on the same photosensitive surface, and if focused pictures are obtained in the visible light region, only out-of-focus pictures can be obtained in the near infrared light region. In other words, if an imaging element whose configuration is as described above were designed on paper, the optical system would be difficult to realize and it is highly likely that such an element could not be put in practical use.

Moreover, conventional visible light imaging devices such as described in Published Japanese Translation of PCT International Application (Tokuhyo) No. 2002-513145 are confined to three-layer semiconductor doping structure and are configured to detect visible light. For that reason, when three primary colors of visible light are to be detected, near infrared light cannot be detected. Suppose that the depth of a photodiode is readjusted such that visible light of two kinds of wavelength regions and near infrared light, a total of three kinds of light, can be detected. However, as described above, it is impossible to make a perfect achromatic optical system for a very wide range of wavelengths from the visible light region to the near infrared light region (from 400 nm to 1000 nm). So if visible light images are to be sharpened, near infrared light images go out of focus.

After all, modification of an imaging element alone is insufficient for imaging clearly from visible light to near infrared light.

DISCLOSURE OF INVENTION

The present invention solyes the conventional problems mentioned above. A purpose of the invention is to provide an excellent visible light and near infrared light imaging device and method which can obtain clear color images with good color reproducibility by a visible light detection means and can at the same time obtain clear luminance information or monochrome images by a near infrared light detection means.

The imaging device related to the invention comprises: an optical system means in which three components of visible light and near infrared light in different wavelength regions severally (or respectively) form images at different locations according to their wavelengths; and an imaging element which has a plurality of pixels; wherein said plurality of pixels include pixels having a visible light detection means and pixels having a near infrared light detection means, said visible light detection means detecting said three components of visible light which form images at locations of different depths in the same pixel according to their wavelengths, said near infrared light detection means detecting near infrared light which forms an image in a pixel at a location of a depth different from the depths at which said three components of visible light form images. In the invention, the visible light detection means has three detectors which are provided at locations of different depths according to wavelength dependence of light absorption depth and detect visible light in three different wavelength regions of blue, green, and red, and the near infrared light detection means has a detector which is provided at a location of a depth different from the depths of the three detectors and detects near infrared light.

With such a configuration, clear color images with good color reproducibility can be obtained by a visible light detection means and at the same time clear luminance information or monochrome images can be obtained by a near infrared light detection means. As a result, for example, color images with good color reproducibility and high color resolution can be provided in the daytime; sharp monochrome images can be obtained even in a dark place, e.g. nighttime, by shining some light; and, moreover, composites of those images can equivalently increase the dynamic range. An excellent imaging device can thus be provided.

In the invention, the imaging element has a configuration in which pixels having the visible light detection means and pixels having the near infrared light detection means are alternately arranged in rows and columns.

With this configuration, a filter which can prevent the influence of near infrared light can be further added to the visible light detection means, so that color images with very good color reproducibility can be obtained.

In the invention, the imaging element has a configuration in which pixels having the visible light detection means and pixels having the near infrared light detection means are uniformly arranged such that the number ratio of the pixels is one to three.

In the invention, the imaging element has a configuration in which pixels having the visible light detection means and pixels having the near infrared light detection means are uniformly arranged such that the area ratio of the pixels is one to three.

In this way, two kinds of pixels are arranged such that the number ratio or area ratio is one to three, so that luminance resolution, rather than color resolution, can be improved and clear luminance information of a range up to the near infrared light region can be obtained.

An imaging device of another aspect of the invention comprises: an optical system means in which three components of visible light and near infrared light in different wavelength regions severally form images at different locations according to their wavelengths; and an imaging element which has a plurality of pixels; wherein the plurality of pixels have a detection means which detects the three components of visible light and the near infrared light which severally form images at locations of different depths in the same pixel according to their wavelengths.

In the invention, the plurality of pixels comprise a detection means which detects three components of visible light of blue, green, and red and near infrared light by means of four detectors which are provided at locations of different depths according to wavelength dependence of light absorption depth.

In terms of color reproducibility and detection loss, such a configuration is inferior to a configuration in which different pixels detect visible light and near infrared light separately. However, there is an advantage that resolutions of both color images and near infrared images can similarly be improved.

In the invention, the optical system means has a configuration in which a focal length monotonously increases according to wavelengths of light from short-wavelength visible light to near infrared light so that visible light in three different wavelength regions of blue, green, and red and near infrared light form images at different locations.

With this configuration, clear pictures can be imaged in both visible light and near infrared light without being out of focus.

Moreover, an imaging method related to the invention comprises: making three components of visible light and near infrared light in different wavelength regions severally form images at different locations according to their wavelengths; detecting the three components of visible light and the near infrared light using the fact that wavelength dependence of light absorption depth varies; and imaging pictures of both the three components of visible light and the near infrared light.

With this configuration, clear color images with good color reproducibility can be obtained, and at the same time clear luminance information or monochrome images can be obtained. As a result, for example, color images with high color reproducibility and color resolution can be provided in the daytime; sharp monochrome images can be obtained even in a dark place, e.g. nighttime; and, moreover, composites of those images can equivalently increase the dynamic range. An excellent imaging method can thus be provided.

As described above, clear color images with good color reproducibility can be obtained and clear luminance information or monochrome images can be obtained according to the invention.

BEST MODE OF EMBODYING THE INVENTION

Each embodiment of the invention will now be described with reference to the drawings.

FIRST EMBODIMENT

Figure 1:
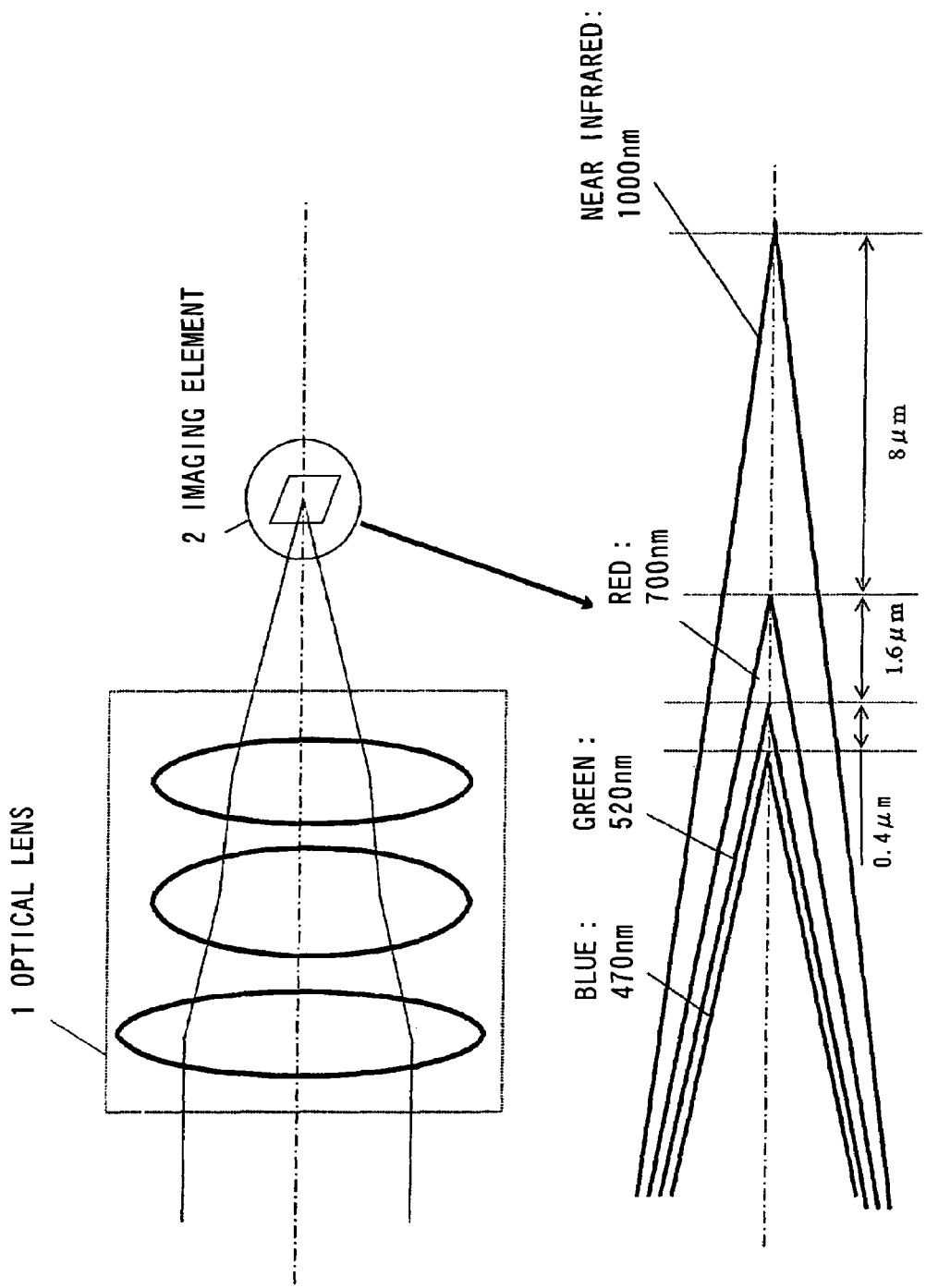
FIG. 1 illustrates a visible light and near infrared light imaging device and method related to the invention, and shows the essence of an optical system of the invention.
Figure 2:
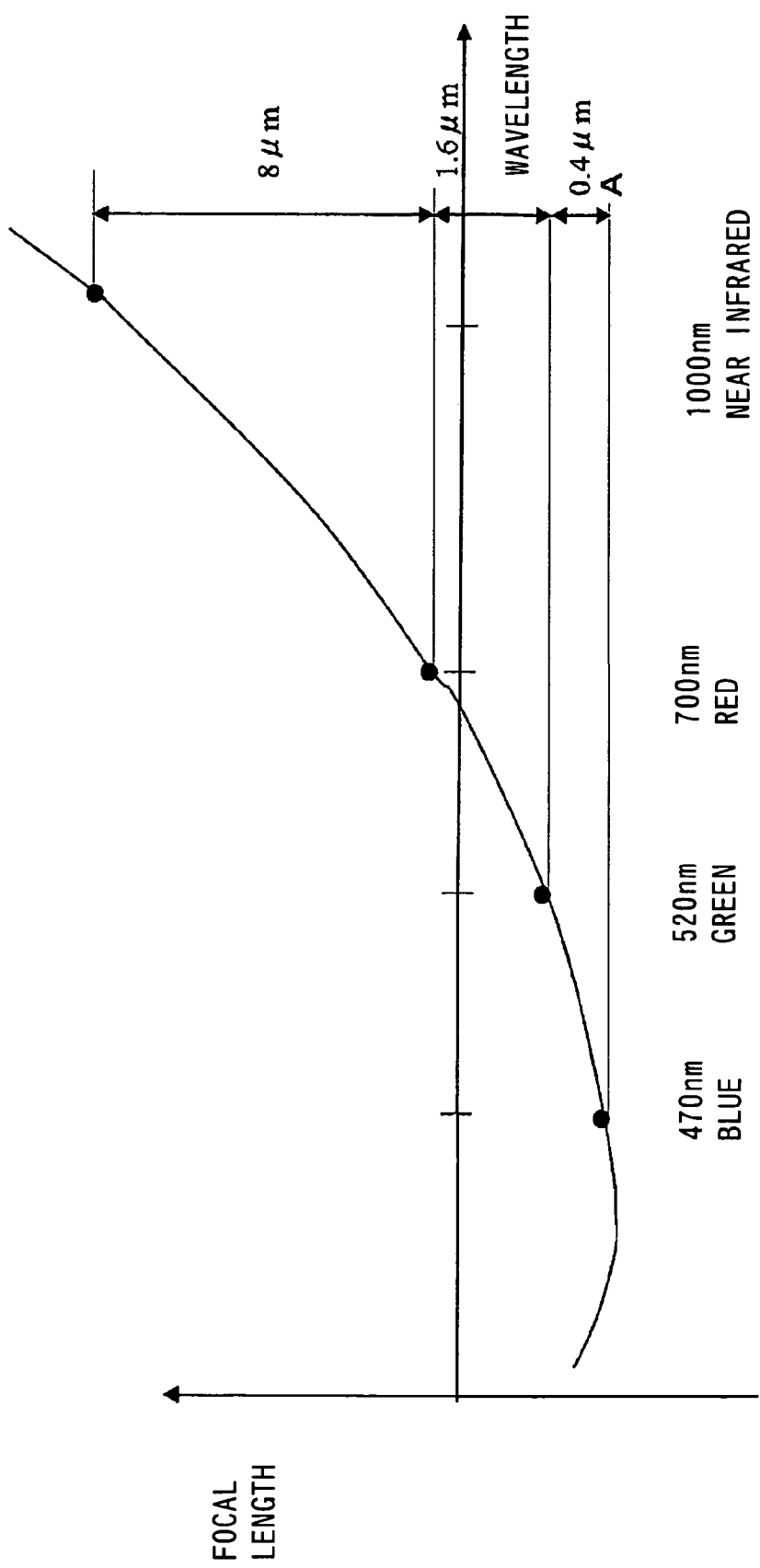
FIG. 2 shows the relation between the focal length of the optical system related to the invention and wavelengths.

As shown in FIG. 1, a visible light and near infrared light imaging device related to the invention has an optical lens 1. The optical lens 1 is an optical system whose focal length is variable according to wavelengths, and makes three components of visible light and near infrared light in different wavelength regions form images at different locations according to their wavelengths. The optical lens 1 condenses light from an external subject and forms an image on an imaging element 2. In the lower part of FIG. 1, light pencils from the optical lens 1 are shown separately by different wavelengths. The optical lens 1 forms images at different locations according to wavelengths as described above. This is shown more specifically in FIG. 2. For example, if blue of 470 nm is a focal-point reference A, the focal length of green of 520 nm is 0.4 µm longer than the reference A. Similarly, the focal length of red of 700 nm is 2 µm longer than the reference A, and the focal length of near infrared of 1000 nm is 10 µm longer than the reference A. As shown in FIG. 2, the focal length of the optical lens 1 increases according to wavelengths, from that of short-wavelength light in visible light to near infrared light, and therefore three components of visible light and near infrared light form images at different locations.

Figure 3:
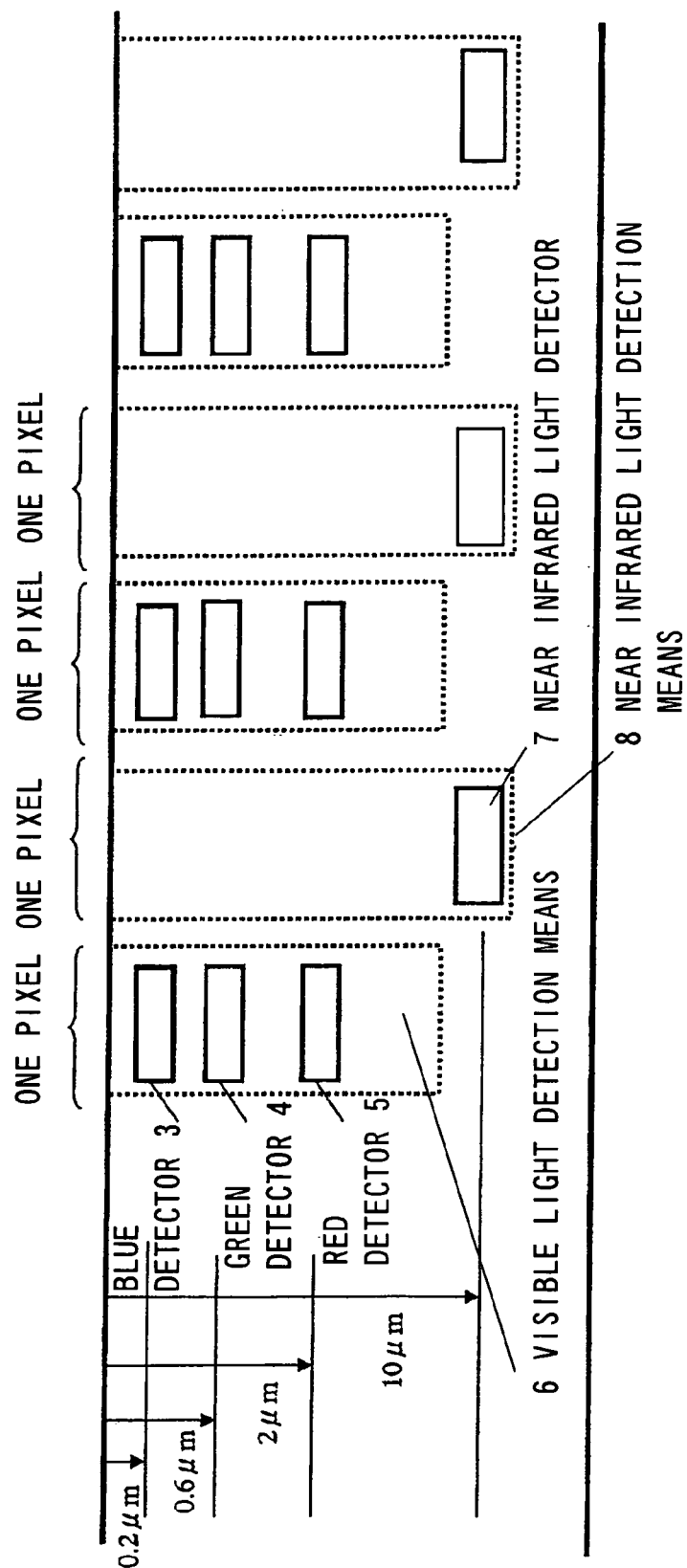
FIG. 3 shows a configuration of an imaging element related to a first embodiment of the invention.

On the other hand, the imaging element 2 composes a light receiving section together with the optical lens 1 qua an optical system. FIG. 3 schematically shows the configuration of the imaging element 2. As shown in FIG. 3, visible light detection sections 6 and near infrared light detection sections 8 are arranged in the imaging element 2. The visible light detection section 6 comprises three detectors of different depths, and it detects with these three detectors three components of visible light in different wavelength regions which are condensed by the optical lens 1 and form images, using the fact that wavelength dependence of light absorption depth varies. The near infrared light detection section 8 has a detector which detects near infrared light.

The visible light detection section 6 is composed of a blue detector 3, a green detector 4, and a red detector 5. These detectors 3 to 5 are photodiodes located at different depths from the surface. Three primary colors are obtained separately, so that any color is reproducible. Unlike the conventional Japanese Patent Laid-Open Application No. 2002-142228, one pixel can obtain output of three colors in visible light. As described in explanations of conventional arts, it is actually impossible to separate light into three colors completely. But a degree of mixing of each color is known (or can be measured) in advance, so corrections can be made.

The infrared light detection section 8 is composed of a near infrared light detector 7, which is a photodiode. In order to detect near infrared light mainly, the near infrared light detector 7 is located around the depth of the highest detectability. As described in Published Japanese Translation of PCT International Application (Tokuhyo) No. 2002-513145 as reference data, near infrared light is absorbed at a depth deeper than red light in a silicon layer. So, the near infrared light detector 7 is located, for example, at the depth of 10 µm. Luminance information can be obtained from the visible light detector 6 by combining three colors with one another. If output from the near infrared light detector 7 is to be in proportion to overall light intensity, output from the near infrared light detector 7 may be used as luminance information.

Figure 4:
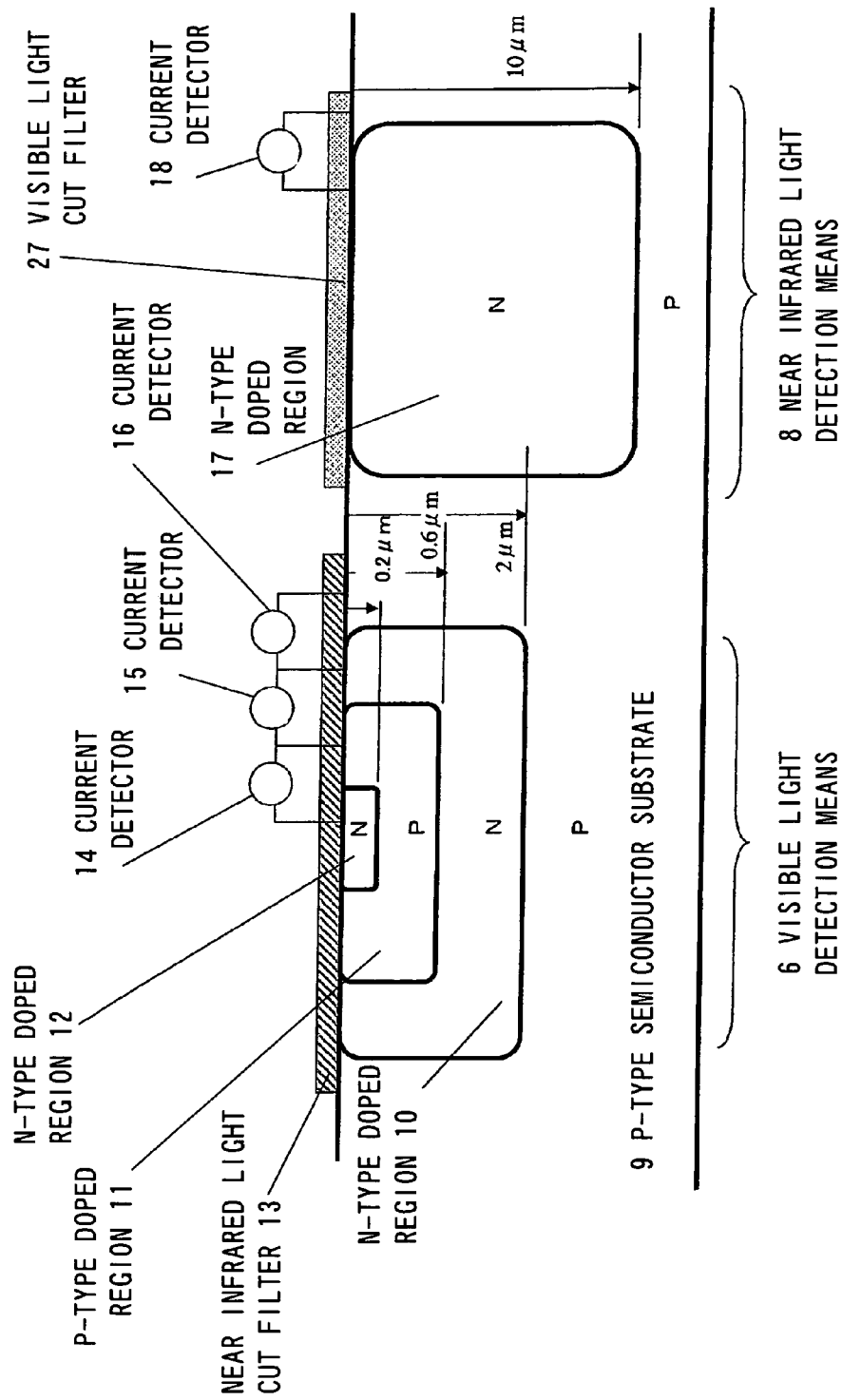
FIG. 4 shows a configuration of an imaging element related to the first embodiment of the invention.

FIG. 4 shows the configuration of the imaging element 2 related to the first embodiment. As shown in FIG. 4, the configuration of the visible light detection section 6 on the left of the figure is almost similar to the conventional example. An n-type doped region 10 of an n-type semiconductor is formed on a p-type semiconductor substrate 9. Similarly, a p-type doped region 11 is formed thereon. Moreover, an n-type doped region 12 is formed thereon. In this way, a three-layer semiconductor structure (triple-well structure) is made on the substrate. Three current detectors 14, 15, and 16 detect output of B, G, and R of visible light. But if the three colors are somewhat influenced by near infrared light, colors reproduced later may be different from real colors. In order to avoid this, a near infrared light cut filter 13 is placed in front of the light entrance to the current detectors. The influence of light in the near infrared region is thus eliminated.

On the other hand, in the near infrared light detection section 8 on the right of FIG. 4, an n-type doped region 17 of an n-type semiconductor is formed additionally on the p-type semiconductor substrate 9. With the pn junction reversely biased (the n side is at higher potential than the p side), the current detector 18 detects a current when near infrared light comes in. In FIG. 4, the pn junction surface, that is, the near infrared light detector 7 in FIG. 3, is provided at the depth of 10 µm. In this way, the near infrared light detector 7 is located where detectability for near infrared light is the highest. However, near infrared light has a very wide wavelength range from 770 nm to 1000 nm. Accordingly, the above-mentioned value may vary depending on the purpose of detection, i.e. which wavelength region is to be mainly detected.

Now, by means of the optical lens 1 described in FIGS. 1 and 2, light in desired wavelength regions focuses on each detection area of the four current detectors 14, 15, 16, and 18. In other words, light of desired color comes into focus on a detection area of each detector. In order to realize this, the optical lens 1 is deliberately provided with aberration.

In FIG. 4, visible light entering the near infrared light detection section 8 on the right would cause defocusing. Most visible light is absorbed until it reaches around the photodiode detection area, i.e. the pn interface, but some visible light that comes through without being absorbed may become a factor of defocusing. So, as shown in FIG. 4, a visible light cut filter 27 may be added in front of the light entrance.

Figure 5:
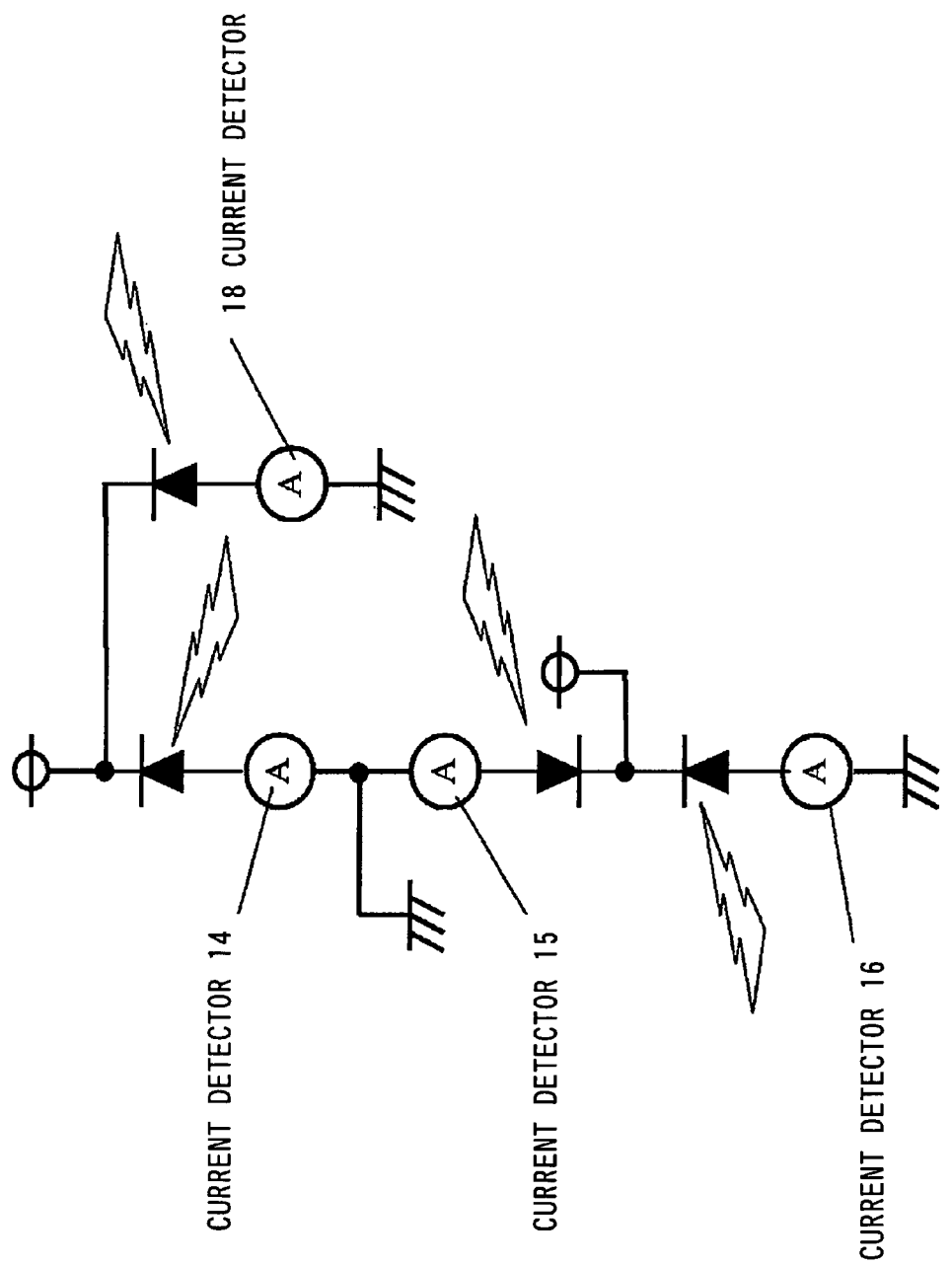
FIG. 5 is an equivalent circuit schematic of an imaging element related to the first embodiment of the invention.

FIG. 5 shows an equivalent circuit schematic. As shown in FIG. 5, each photodiode is reversely biased, and currents corresponding to incoming light are detected. In the interests of simplicity, power supply and grounds are common in the equivalent circuit schematic of FIG. 5. However, the invention is not limited to this.

Figure 6:
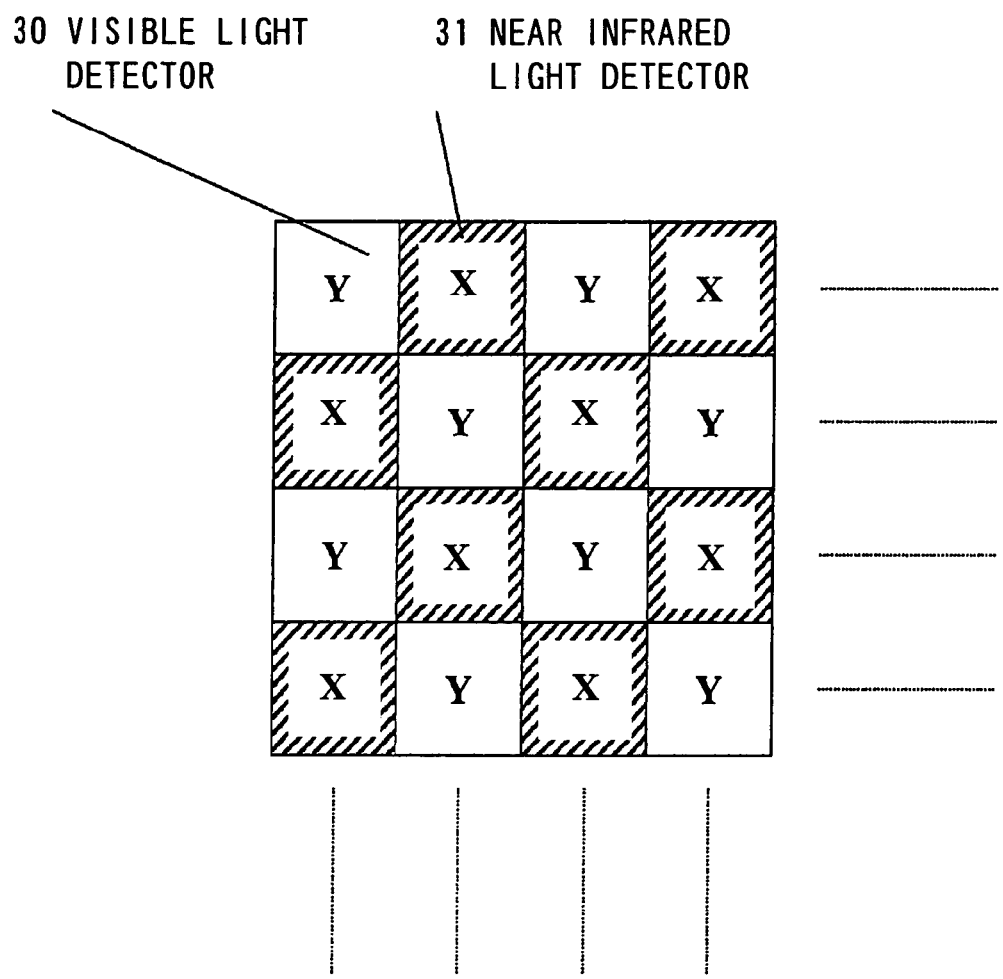
FIG. 6 shows an example of a mixed arrangement of visible light detection sections and near infrared light detection sections on an imaging element related to the first embodiment of the invention.
Figure 7:
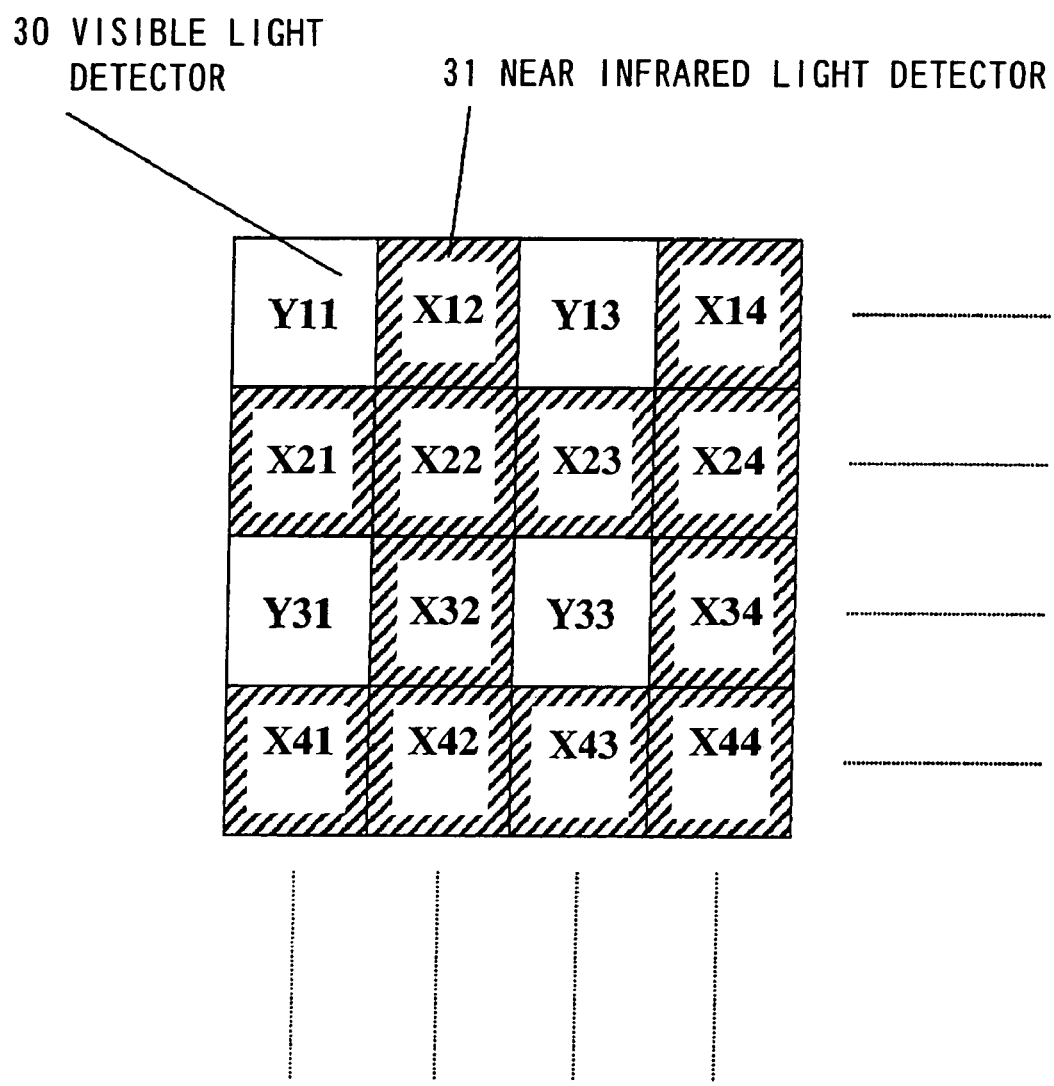
FIG. 7 shows an example of a mixed arrangement of visible light detection sections and near infrared light detection sections on an imaging element related to the first embodiment of the invention.

FIGS. 6 and 7 show examples of actual arrangements of visible light detection sections 6 and near infrared light detection sections 8.

In FIGS. 6 and 7, visible light detection sections 6 and near infrared light detection sections 8 are arranged in a mixed manner. In FIG. 6, a visible light detector 30 composes the visible light detection section 6 and a near infrared light detector 31 composes the near infrared light detection section 8. In FIG. 6, the visible light detectors 30 and the near infrared light detectors 31 are alternately arranged in rows and columns in a mixed manner, and the ratio of the number or area of both pixels is one to one. As for visible light information in the area of the near infrared light detection section 8, an average for adjacent visible light detection sections 6 may be taken. Generally, resolution of color information may be lower than luminance resolution assuming that the use is humans' seeing images. However, this arrangement has higher resolution in both luminance and color than, for example, the conventional Japanese Patent Laid-Open Application No. 2002-142228.

Output from the near infrared light detection section 8 is useful as luminance information for detecting near infrared light in a relatively wide wavelength region. Sunlight especially contains a lot of near infrared light components. There are some cases where luminance information is obtained with a rather better S/N ratio from near infrared light than from the three RGB colors. Therefore, luminance information is obtained from adjacent near infrared light detection section 8. Alternatively, information from the near infrared light detection section 8 is used to correct output from the visible light detection section 6.

For example, luminance can usually be obtained by the following equation 1 when RGB is known.

$$Y = 0.299 \times R + 0.587 \times G + 0.114 \times B \quad (1)$$

In the equation 1, luminance is a linear sum of RGB.

In contrast to this, luminance may be obtained by the following equation 2 when average luminance information I is derived from a plurality of adjacent near infrared light detection sections 8.

$$Y = c1 \times R + c2 \times G + c3 \times B + c4 \times I \quad (2)$$

(where $c1+c2+c3+c4=1$)

FIG. 7 shows a configuration in which luminance information from near infrared light is actively used. With the configuration in FIG. 7, the S/N ratio and resolution of luminance information can be improved. Again in FIG. 7, the visible light detector 30 composes the visible light detection section 6 and the near infrared light detector 31 composes the near infrared light detection section 8. Besides that, the visible light detectors 30 and the near infrared light detectors 31 are alternately arranged in rows and columns in a mixed manner. However, the ratio of the number or area of visible light detection sections 6 to that of near infrared light detection sections 8 is one to three in FIG. 7. More specifically, a set of one pixel of the visible light detection section 6 (visible light detector 30) and three pixels of the near infrared light detection sections (near infrared light detectors 31) is arranged in a square, and the sets are arranged in rows and columns. In this way, they are uniformly arranged in the ratio of one to three. Here, if luminance is obtained from a linear sum of three components of visible light, local fluctuations in RGB may cause luminance to fluctuate, which becomes noise. However, with the configuration in FIG. 7, luminance resolution, rather than color resolution, can be improved. As a result, clear luminance information can be obtained for the range up to near infrared light.

SECOND EMBODIMENT

Figure 8:
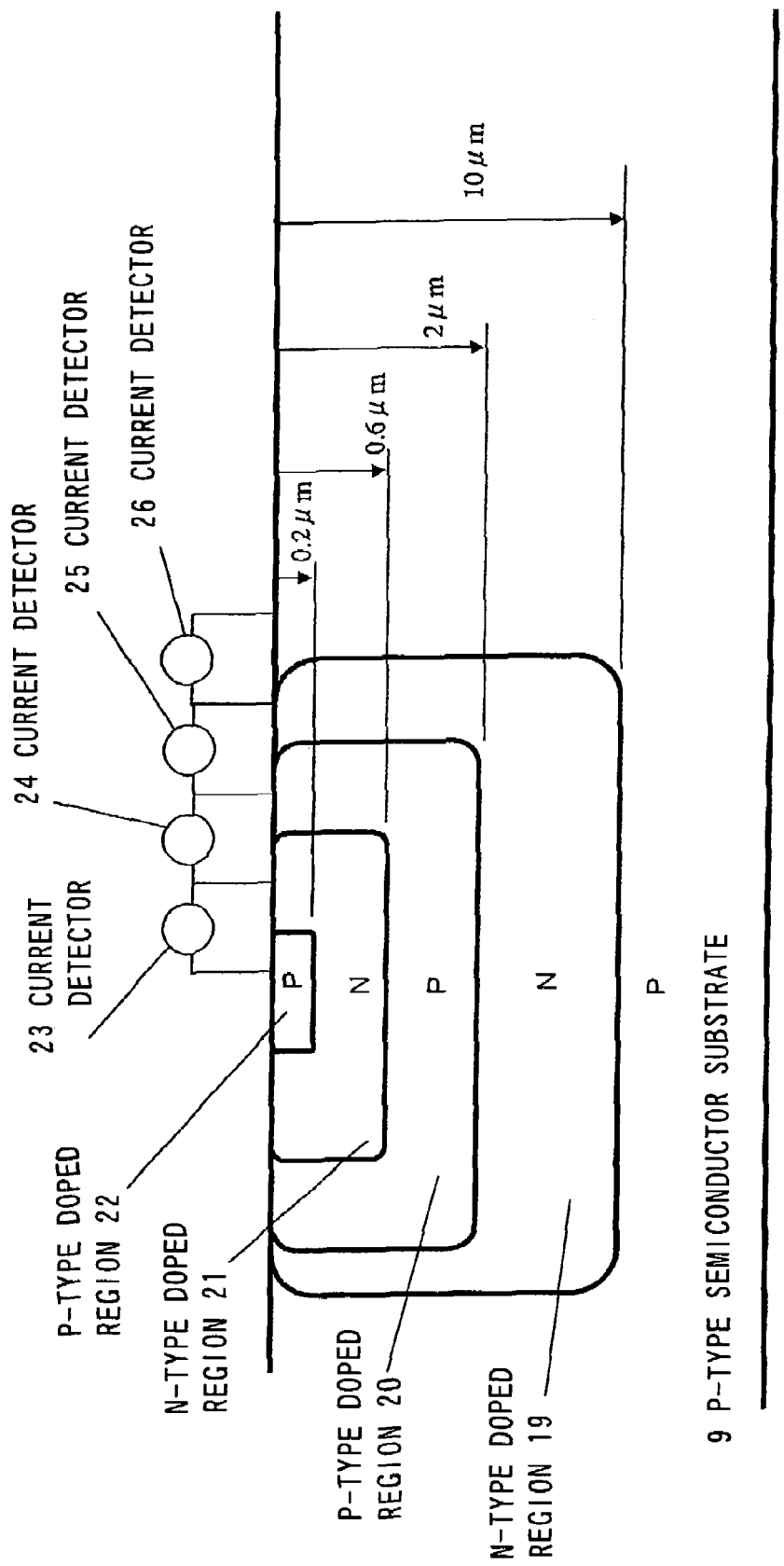
FIG. 8 shows a configuration of an imaging element related to a second embodiment of the invention.
Figure 9:
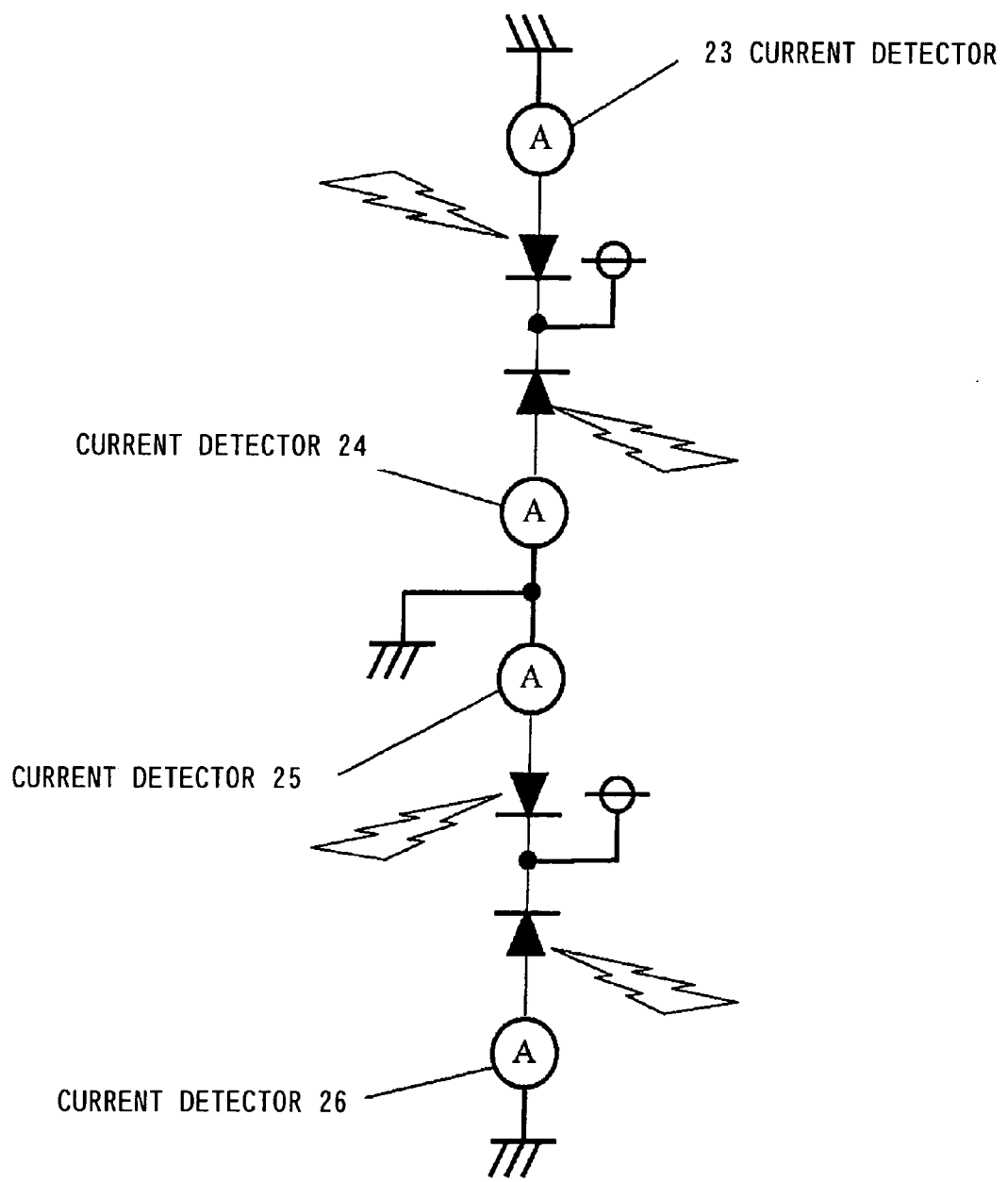
FIG. 9 is an equivalent circuit schematic of an imaging element related to the second embodiment of the invention.
Figure 10:
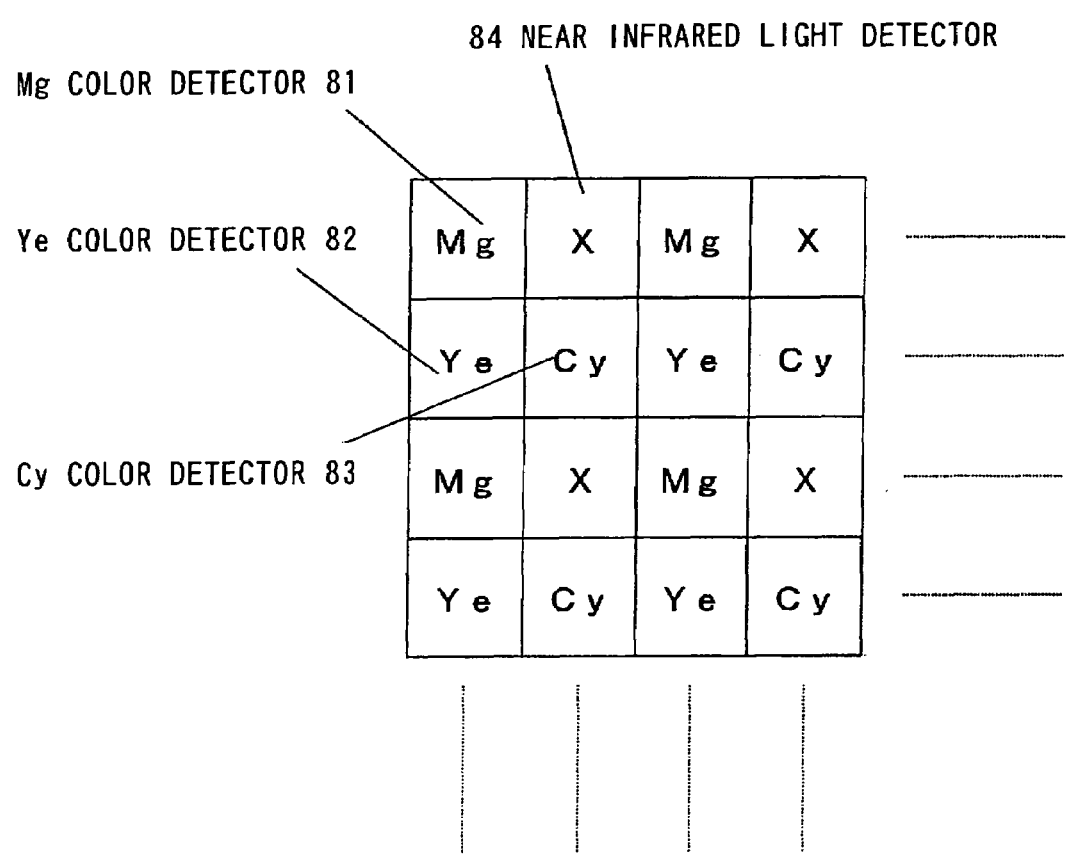
FIG. 10 shows an example of an imaging element of a conventional visible light and near infrared light imaging device.
Figure 11:
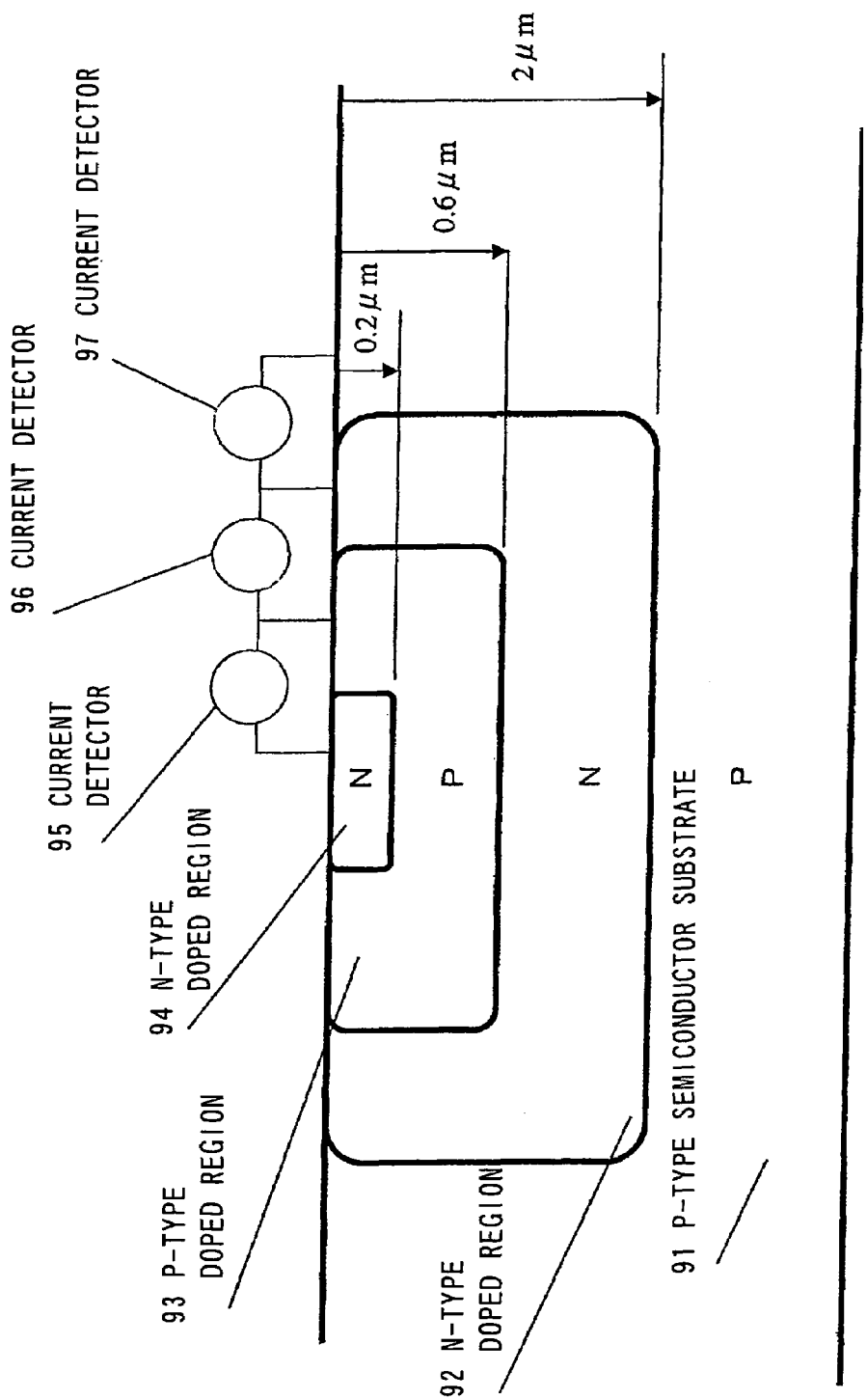
FIG. 11 shows an example of an imaging element of a conventional visible light imaging device.
Figure 12:
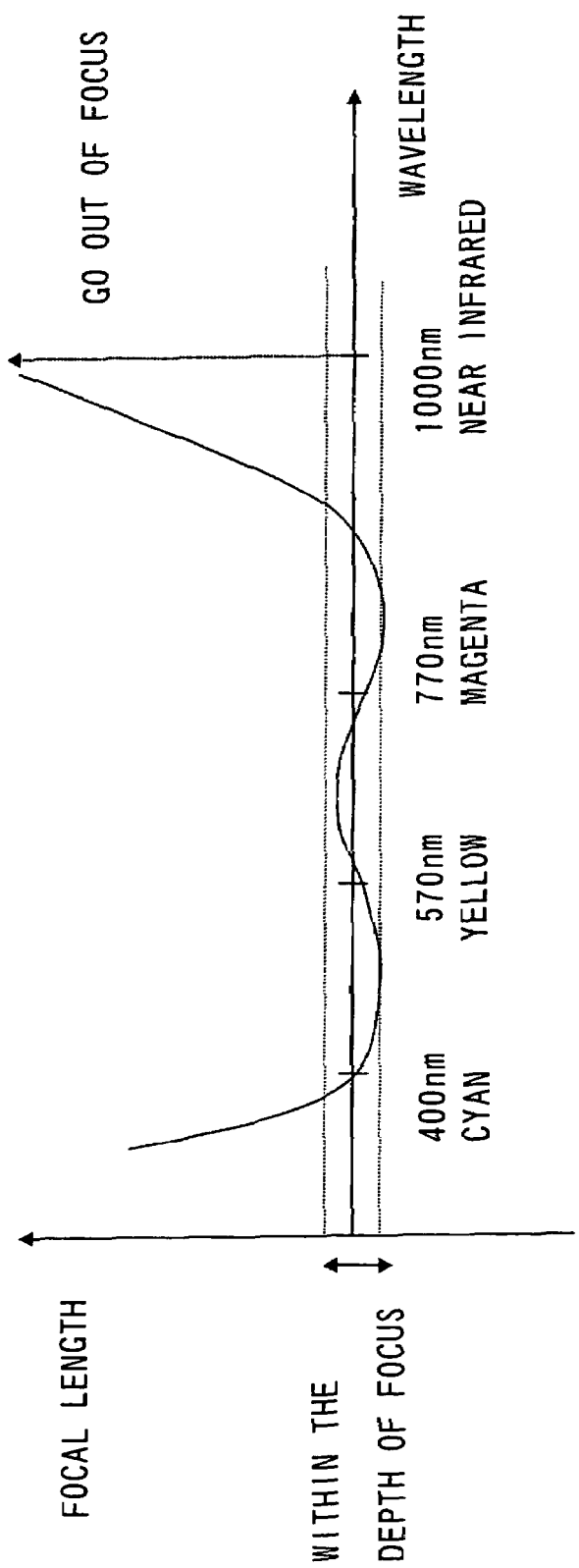
FIG. 12 illustrates an achromatic optical system used in a conventional visible light imaging device.

Next, FIG. 8 shows a configuration of an imaging element related to a second embodiment, and FIG. 9 is an equivalent circuit schematic of an imaging element related to the second embodiment. In the imaging element shown in FIG. 8, a visible light detection section and near infrared light detection section are placed in one pixel. The figure shows one pixel, which comprises a detection section to separate and detect three components of visible light and near infrared light in different wavelength regions, four components in total. In other words, four current detectors 23, 24, 25, and 26 arranged in one pixel detect B, G, and R of visible light and near infrared light. As shown in FIG. 8, an n-type doped region 19 of an n-type semiconductor is formed on a p-type semiconductor substrate 9. Similarly, a p-type doped region 20 is formed thereon. Moreover, an n-type doped region 21 is formed thereon. Furthermore, a p-type doped region 22 is formed thereon. In this way, a four-layer semiconductor structure (quadruple-well structure) is made on the substrate. Since each pn interface region functions as a photosensor, four photosensors can be made up in total. The depth of each interface, i.e. detection area, is determined and controlled as previously described. Light in four wavelength regions of blue, green, red, and near infrared light can thus be detected. Actually, it is difficult to separate four colors of light completely, and a mixture occurs. But a degree of mixing of each color is known (or can be measured) in advance, so corrections can be made.

FIG. 9 is an equivalent circuit schematic of FIG. 8. Four photodiodes are reversely biased, and currents corresponding to incoming light are detected. In the interests of simplicity, power supply and grounds are common. However, the invention is not limited to this.

In the above-described second embodiment, the mixing of visible light into near infrared light is unavoidable. As a result, color reproducibility may be slightly worse in the second embodiment than in the first embodiment even if corrections are made. However, there is an advantage that resolution of both color and luminance is better because one pixel simultaneously processes four colors.

Incidentally, visible light is separated into three wavelength regions in the embodiment, but it may be separated into four or more wavelength regions. In this case, good color images with higher color reproduction and resolution can be obtained.

While there has been described what are at present considered to be preferred embodiments of the invention, it will be understood that various modifications may be made thereto, and it is intended that appended claims cover all such modifications as fall within the true spirit and scope of the invention.

INDUSTRIAL APPLICABILITY

As described above, good color images and near infrared light images can be obtained according to the invention, and the invention is useful as an imaging device and method or the like.

The invention claimed is:

1. An imaging device comprising:
   an optical system means that provides a focal length which increases according to wavelengths of light from short-wavelength visible light to near infrared light so that three components of visible light and near infrared light in different wavelength regions severally form images at different locations according to their wavelengths; and
   an imaging element which has a plurality of pixels;
   wherein said plurality of pixels include pixels having a visible light detection means and pixels having a near infrared light detection means, said visible light detection means detecting said three components of visible light which form images at locations of different depths in the same pixel according to their wavelengths, said near infrared light detection means detecting near infrared light which forms an image in a pixel at a location of a depth different from the depths at which said three components of visible light form images.

2. The imaging device according to claim 1, wherein said visible light detection means has three detectors which are provided at locations of different depths according to wavelength dependence of light absorption depth and detect visible light in three different wavelength regions of blue, green, and red, and said near infrared light detection means has a detector which is provided at a location of a depth different from the depths of said three detectors and detects near infrared light.

3. The imaging device according to claim 1, wherein said imaging element has a configuration in which pixels having said visible light detection means and pixels having said near infrared light detection means are alternately arranged in rows and columns.

4. The imaging device according to claim 1, wherein said imaging element has a configuration in which pixels having said visible light detection means and pixels having said near infrared light detection means are uniformly arranged such that at least one of the number ratio of the pixels and the area ration of the pixels is one to three.

5. The imaging device according to claim 1, wherein said optical system means provides a focal length which monotonously increases according to wavelengths of light from short-wavelength visible light to near infrared light so that visible light in three different wavelength regions of blue, green, and red and near infrared light form images at different locations.

6. An imaging device comprising:
   an optical system means that provides a focal length which increases according to wavelengths of light from short-wavelength visible light to near infrared light so that three components of visible light and near infrared light in different wavelength regions severally form images at different locations according to their wavelengths; and
   an imaging element which has a plurality of pixels;
   wherein said plurality of pixels detect said three components of visible light and said near infrared light which severally form images at locations of different depths in the same pixel according to their wavelengths.

7. The imaging device according to claim 6, wherein said plurality of pixels detect three components of visible light of blue, green, and red and near infrared light by means of four detectors which are provided at locations of different depths according to wavelength dependence of light absorption depth.

8. The imaging device according to claim 7, wherein said optical system means provides a focal length which monotonously increases according to wavelengths of light from short-wavelength visible light to near infrared light so that visible light in three different wavelength regions of blue, green, and red and near infrared light form images at different locations.

9. An imaging method comprising the steps of:
   making three components of visible light and near infrared light in different wavelength regions severally form images at different locations according to their wavelengths using an optical system means that provides a focal length which increases according to wavelengths of light from short-wavelength visible light to near infrared light;
   detecting said three components of visible light and said near infrared light using the fact that wavelength dependence of light absorption depth varies; and
   imaging pictures of both said three components of visible light and said near infrared light.

* * * * *